US007660687B1

(12) United States Patent
De et al.

(10) Patent No.: US 7,660,687 B1
(45) Date of Patent: Feb. 9, 2010

(54) ROBUST MEASUREMENT OF PARAMETERS

(75) Inventors: Indranil De, Mountain View, CA (US); Mark A. McCord, Los Gatos, CA (US); David L. Adler, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 440 days.

(21) Appl. No.: 11/420,243

(22) Filed: May 25, 2006

(51) Int. Cl.
*G01D 18/00* (2006.01)
*G06F 17/40* (2006.01)
*G06F 19/00* (2006.01)

(52) U.S. Cl. .......................... 702/85; 73/1.01; 73/1.88; 73/866.1; 250/306; 250/310; 250/491.1; 250/492.2; 250/492.3; 378/70; 378/86; 378/87; 378/204; 378/207; 382/100; 382/141; 382/145; 382/168; 382/169; 382/170; 438/14; 438/17; 702/1; 702/33; 702/35; 702/40; 702/86; 702/87; 702/88; 702/107; 702/127; 702/187; 702/189

(58) Field of Classification Search .................. 367/138, 367/137; 702/180, 1, 33, 35, 38, 40, 85, 702/86, 87, 88, 104, 105, 107, 127, 128, 702/179, 181, 187, 189; 73/1.01, 1.88, 432.1, 73/865.8, 865.9, 866, 866.1; 250/306, 307, 250/308, 309, 310, 311, 492.1, 492.2, 492.21, 250/492.23, 492.3; 356/237.1, 237.2, 237.3, 356/237.4, 237.5, 237.6, 337, 338, 388, 394; 378/1, 51, 58, 62, 63, 64, 70, 71, 82, 86, 378/87, 162, 204, 207; 382/100, 141, 144, 382/145, 146, 147, 168, 169, 170; 438/14, 438/16, 17, 800; 716/1, 4, 5

See application file for complete search history.

(56) References Cited

U.S. PATENT DOCUMENTS

| 3,045,123 | A | * | 7/1962 | Frommer | 250/565 |
| 3,146,347 | A | * | 8/1964 | Ziegler | 250/307 |
| 3,188,471 | A | * | 6/1965 | Hansen et al. | 250/308 |
| 3,197,638 | A | * | 7/1965 | Sinclair | 378/86 |
| 3,219,817 | A | * | 11/1965 | Mollenstedt | 250/306 |
| 3,424,902 | A | * | 1/1969 | Colmery, Jr. et al. | 250/308 |
| 3,549,999 | A | * | 12/1970 | Norton | 324/751 |
| 4,950,911 | A | * | 8/1990 | Williams et al. | 250/559.45 |
| 5,416,557 | A | * | 5/1995 | Nagasaki et al. | 396/52 |

* cited by examiner

*Primary Examiner*—Edward R Cosimano
(74) *Attorney, Agent, or Firm*—Luedeka, Neely & Graham, P.C.

(57) ABSTRACT

A method of increasing consistency between separate parametric measurement readings that are taken with an electron beam imaging tool at different times within a period of time, by correcting drift in the imaging tool at a time frequency that is less than a time period during which the drift is anticipated to be undesirably large.

19 Claims, 3 Drawing Sheets

ROBUST MEASUREMENT OF PARAMETERS

FIELD

This invention relates to the field of integrated circuit fabrication. More particularly, this invention relates to electron beam measurement systems, such as those used to monitor integrated circuit structures, materials, and fabrication processes.

BACKGROUND

Electron beam imaging systems are typically used for imaging integrated circuits. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

The integrated circuit is impinged with a beam of electrons, and in turn electrons are irradiated from the integrated circuit. The irradiated electrons are collected at the detector where they are converted to an electrical signal. This electrical signal is amplified by an electrical circuitry and the analog signal that is output is converted (or in other words digitized) to a digital signal using an analog-to-digital converter. The relative difference in electron yield as measured from different locations of the sample produces a contrast in the output of the analog signal.

If the range of the output analog signal is matched appropriately to the input range of the analog to digital converter, then the output of the analog to digital converter is a digital stream that shows the contrast at different locations of the sample, which is used to generate a digital image of the sample, also referred to as the electron beam image. In general, the objective is to resolve the contrast in the sample as clearly as possible. For this purpose, the analog amplifier typically has a variable gain and an offset voltage such that the anticipated range of output of the amplifier circuitry can be set to match the input range of the analog to digital converter to the fullest extent, and thereby enable the maximum contrast in the digital image without over-saturation of the digital image. The numeric value of any given pixel in the digital image is generally referred to as the gray level of that pixel.

When certain structures of an integrated circuit are impinged with an incoming electron beam, they produce an electron signal that is indicative of certain electrical and process parameters of interest in the semiconductor fabrication process. Hence, the gray level in the digital image can be used for monitoring these parameters of the fabrication process. If the mapping between the gray level and the parameter of interest is known by modeling techniques or otherwise, then the gray level can also be used to quantitatively extract the value of the parameter of interest. Alternately, one may be interested in only a relative or approximate comparison between one or more of the parameters at measured at different locations on the substrate, or between different substrates for process-control purposes. In this case, comparing the relative intensity of the gray level at these different locations will suffice. One may also choose to bin across different values of the process parameter by binning the gray levels into multiple bins.

Techniques for monitoring electrical and process parameters on a substrate in a semiconductor process line are useful to control these parameters in the line. The method of using the gray levels in the electron image to monitor these parameters is especially useful, since electron beams can be used to probe very small areas of the integrated circuit without using an electrical probe that contacts the substrate. This has an advantage in that the measurement is non-destructive (since it is contact-less) and that the monitoring can be done early in the line before electrical structures are completely formed (since it requires no probe).

Monitoring and controlling semiconductor process parameters using such an electron beam imaging tool typically requires long-term stability in the relationship between the process parameter of interest on the substrate and the measured gray level in the electron beam image. Unfortunately, such long-term stability is often difficult to achieve.

What is needed, therefore, is a system that overcomes problems such as those described above, at least in part.

SUMMARY

The above and other needs are met by a method of increasing consistency between separate parametric measurement readings that are taken with an electron beam imaging tool at different times within a period of time, by correcting drift in the imaging tool at a time frequency that is less than a time period during which the drift is anticipated to be undesirably large.

In this manner, the monitoring and controlling of semiconductor process parameters using such an electron beam imaging tool will have the desired long-term stability in the relationship between the process parameter of interest on the substrate and the measured gray level in the electron beam image.

According to another aspect of the invention there is described a method of characterizing image data by extracting characterizing data from the image data, where the characterizing data is characteristic of properties of a sample from which the image data is gathered, creating a histogram of the characterizing data, and comparing properties of the histogram to historical histogram properties to characterize the image data.

According to yet another aspect of the invention there is described a method of characterizing image data by creating the image data from swath images, extracting characterizing data from the image data, where the characterizing data is characteristic of properties of a sample from which the image data is gathered, and comparing properties of the characterizing data to historical characterizing data properties to characterize the image data.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

The present invention generally relates to methods that can be used to maintain stability in the parametric measurement, such as by controlling tool drift and accounting for tool drift in the measurement of the gray level.

Reference Sample for Gray Level Analysis

One method is to use the gray level from an image from a reference sample having a fixed material composition, a fixed topography, and a fixed surface potential to calibrate the tool. In this manner, the electron yield of the reference sample is adjusted to remain constant over time, and thus the gray level of the tool will also remain constant in time for a given amplifier gain and offset, if the measurement system has not drifted. Generally, however, the measurement system will drift and the gray level will then also shift. In that case, the established relationship between the electron yield and image gray level of an arbitrary sample is preferably recalibrated by observing the shift in the gray level from the reference sample.

An example of such a relationship is next provided. An aluminum substrate with a known electron yield is used as a reference sample. In this example, the substrate has a flat topography and it is electrically grounded. First, a functional relationship between the incident beam and the output gray level is established. The functional block diagram depicted in FIG. 1 is used to describe the process.

Figure 1:
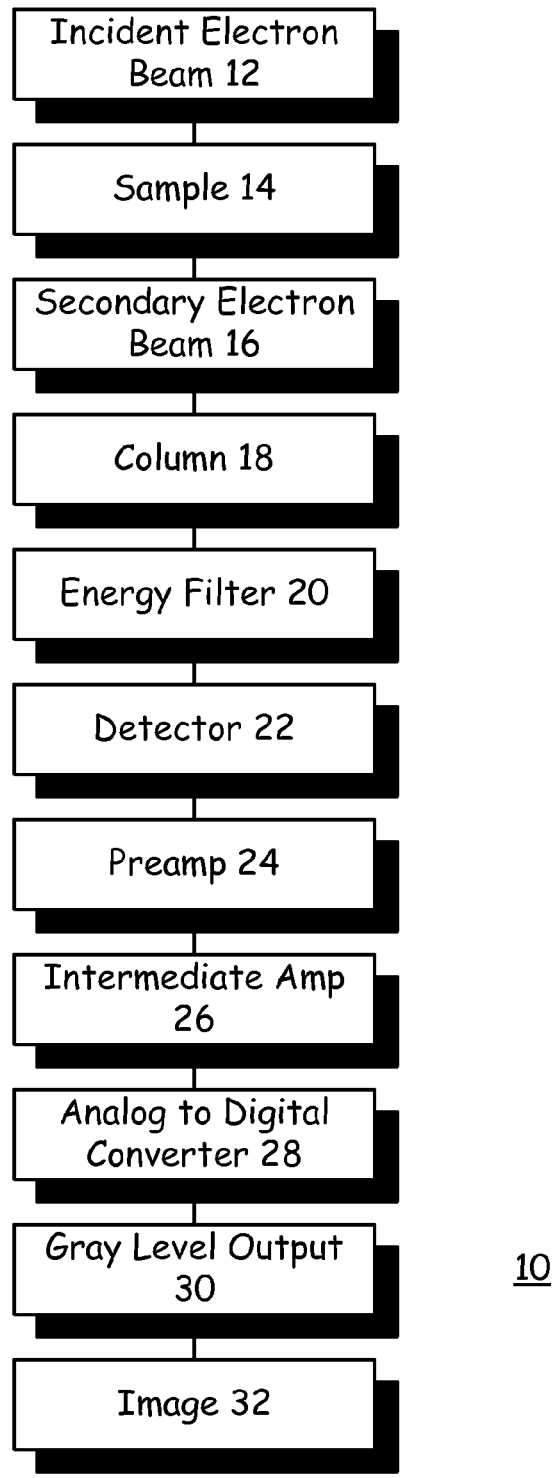
FIG. 1 is a functional block diagram of an electron beam column and video chain.

As depicted in the system 10 of FIG. 1, the incident electron beam 12 is generated and directed toward a sample 14, such as an integrated circuit on a substrate, or in the case of calibration, a reference sample such as described above. The electrons emitted from the sample 14 create a secondary electron beam 16 that is characteristic of the sample, at least in part, and which is directed up a column 18. The secondary electron beam 16 passes through an energy filter 20 to a detector 22, where the analog signal created by the beam 16 is boosted through a preamp stage 24 and an intermediate amplifier stage 26. The boosted analog signal is digitized by the converter 28, and formatted to a gray level output 30. Most preferably, an image 32 is constructed from the output 30, and presented, such as on a display.

The variables that are preferably used for establishing a relationship between the incident beam 12 and the measured gray level output 30 are given in Table 1.

TABLE 1

| Variable | Definition | Units |
|---|---|---|
| BC | Beam current | nA |
| Y | Secondary Electron Beam Yield | — |
| $\eta_1$ | Column efficiency | — |
| $\eta_2$ | Energy filter transparency | — |
| $G_d$ | Detector gain | — |
| $G_{pa}$ | Preamp gain | — |
| $R_{pa}$ | Preamp inverter resistance | Ω |
| $G_{ia}$ | Intermediate-amp gain | dB |
| $V_{off}$ | Intermediate-amp offset | V |
| $I_d$ | Current at output of detector | A |
| $V_{pa}$ | Voltage at output of preamp | V |
| $V_{ia}$ | Voltage at output of intermediate-amp | V |
| $GL_{ADC}$ | ADC Gray Level output in 8-bit resolution | GL |
| α | Fitting parameter to quantify detector again | — |
| β1 | Fitting parameter for preamp output offset | V |
| β2 | Fitting parameter for gain offset. | — |

The equations used for establishing this relationship are given in equations 1-4.

$$I_d = \alpha * BC * Y * \eta_1 * \eta_2 * G_d \quad (1)$$

$$V_{pa} = I_d * G_{pa} * R_{pa} + \beta_1 \quad (2)$$

$$V_{ia} = V_{pa} * (G_{ia} + \beta_2) + V_{off} \quad (3)$$

$$GL_{ADC} = MAX(MIN(255*(-V_{ia}/2),255),0) \quad (4)$$

There are some unknowns in these equations that quantify system drift, such as detector aging, which can lead to shift in the detector gain. The gray level of the image is measured as a function of different values of incoming beam currents, amplifier gain, and offsets, as given in Table 2. By using these gray levels for different input conditions, the parameters in the system that can drift are quantified.

TABLE 2

| Beam Current | Intermediate Amp Gain (db) | Intermediate Amp Offset (V) | Observed Gray Level |
|---|---|---|---|
| 25 | 5 | 0 | 6.96 |
| 25 | 10 | 0 | 23.91 |
| 25 | 10 | −0.4 | 74.668 |
| 25 | 10 | −0.8 | 124.14 |
| 25 | 10 | 0.5 | 0 |
| 25 | 20 | 0 | 99.85 |
| 25 | 25 | 0 | 179.83 |
| 25 | 25 | −0.4 | 231.86 |
| 25 | 25 | 0.5 | 117.1033 |
| 75 | 5 | 0 | 25.56 |
| 75 | 5 | −0.4 | 75.35 |
| 75 | 5 | −0.8 | 126.3189 |
| 75 | 10 | 0 | 75.94 |
| 75 | 15 | 0 | 163.08 |
| 75 | 15 | −0.4 | 213.999 |
| 75 | 15 | 0.4 | 112.67 |
| 125 | 0 | 0 | 18 |
| 125 | 0 | −0.4 | 68.3 |
| 125 | 0 | −0.8 | 118.9 |
| 125 | 5 | 0 | 52 |
| 125 | 10 | 0 | 149.56 |
| 125 | 10 | −0.4 | 202.61 |
| 125 | 10 | 0.4 | 101.26 |

Figure 2:
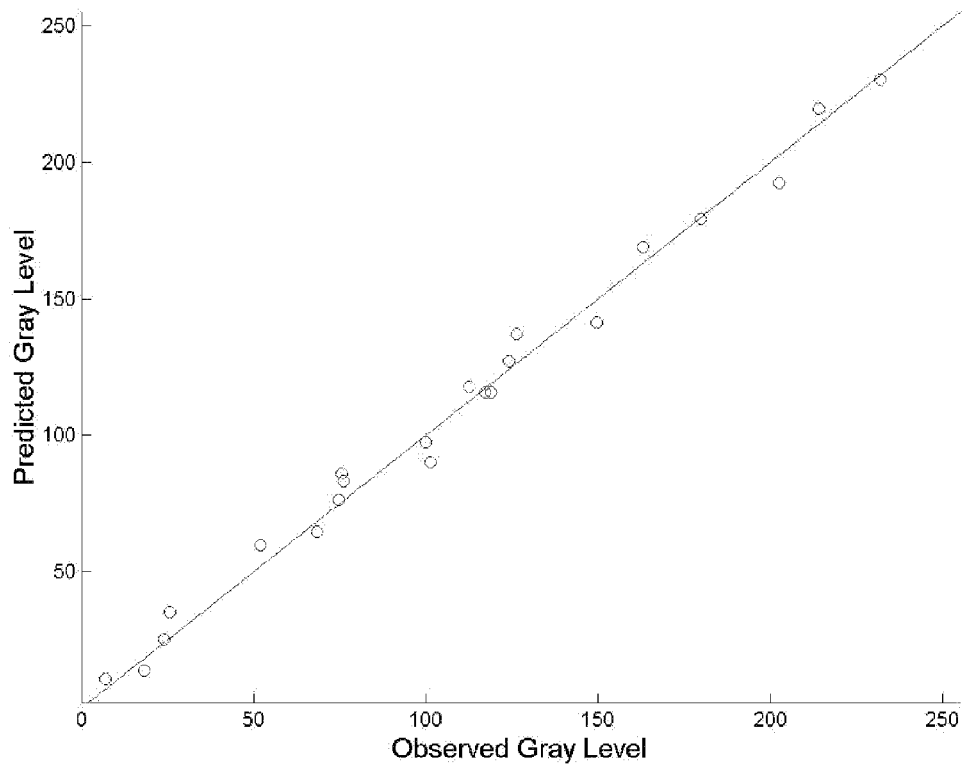
FIG. 2. is a plot of the correlation between the observed gray level and the predicted gray level derived according to a preferred embodiment of the present invention.
Figure 4:
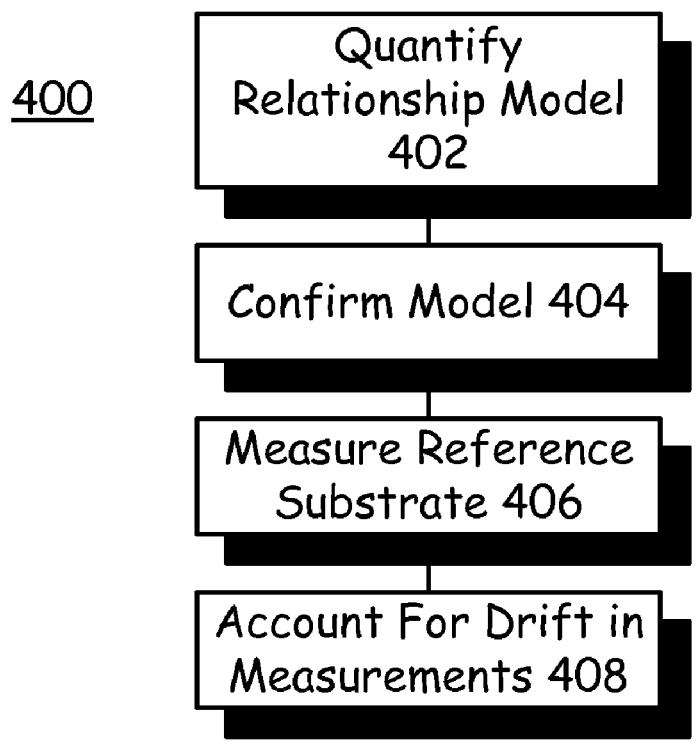
FIG. 4 is a flow chart depicting a method of using a model to correct the drift of an imaging tool, according to an embodiment of the present invention.

With reference now to FIG. 4, a method 400 of using a model to correct the drift of an imaging tool is described. If the system is properly understood and the relationship between the beam current and the output gray level is quantified as described above, and as indicated in block 402, the expected gray levels for the different conditions of beam current, amplifier gains, and offsets will preferably match the observed gray level. FIG. 2 depicts a plot of measured gray levels versus predicted gray levels. The predicted gray level and the expected gray level match well for a variety of conditions, indicating that the drift parameters as described above have been appropriately modeled, as indicated in block 404.

By making periodic measurements on the reference substrate as indicated in block 406, the parameters in the system that drift can be routinely measured and monitored. Once this is done, the effect of system drift can be easily accounted for in the gray level measurement, as indicated in block 408. This preferably includes all the drifts in the video chain, as well as drifts in beam current.

Use of Mirror Mode Imaging for Calibration

Instead of using a reference sample with a known value for the yield, as described in the previous section, in an alternate embodiment the electron column is configured to have a slightly negative landing energy. This means that the beam voltage is slightly more positive than the sample voltage, and the electrons do not actually strike the sample but instead are decelerated to a zero velocity just above the sample, and then accelerated back towards the detector. Such a column is also described as being in mirror mode.

In mirror mode, the number of electrons that appear to come off of the sample is substantially equal to the number of incident electrons directed toward the sample. Hence, the yield of the sample is effectively equal to one, and the secondary yield of the sample does not need to be known for the video chain to be characterized.

Use of Histograms for Finding Metrics from the Image

Figure 3:
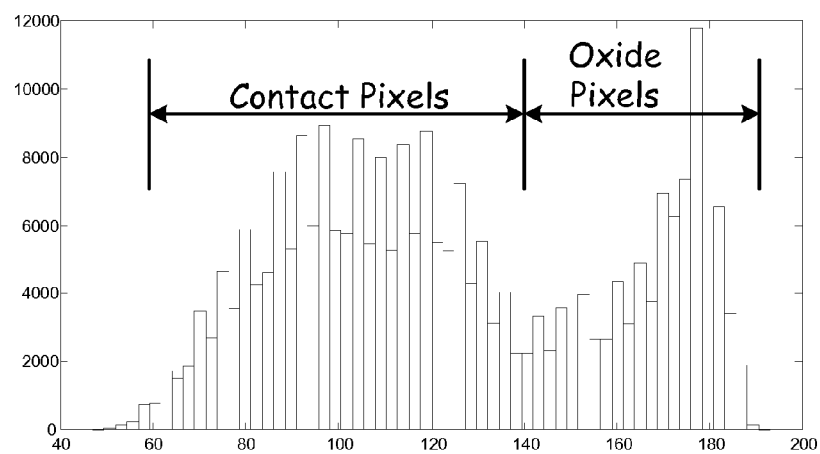
FIG. 3 is a histogram of gray levels for an image.

In general, only the gray levels of certain features of an image are of interest. For example, in the inspection of a contact etch layer of an integrated circuit, the gray levels of the contacts may be of interest. The contacts in an image of an array of contacts appear as dark dots. A histogram of the gray level in the image can be used to get a statistical measure of the brightness of the contacts, as given in FIG. 3. The histogram can be manipulated in a variety of ways to extract different metrics that may correlate best to either process or electrical parameters of interest, which in this case could be the size of the contact or the under-etch oxide. This method may be more stable than measuring the gray level at any one point in the image, or simply averaging the gray level from all the pixels in the image.

For example, to find the brightness of only the contacts in the image, the histogram is preferably mathematically partitioned into two humps. In this case, the darker hump in the histogram is produced by the darker pixels in the contact, and the lighter hump in the histogram is produced by the lighter pixels in the oxide areas. The mean value of the darker hump is preferably used to determine the mean brightness of the contacts. Similarly, the mean value of the lighter hump is preferably used to determine the mean brightness of the oxide. This process preferably enables the brightness extracted from the contacts to be independent of the brightness from the surrounding oxide, and tends to be more robust than taking the average gray level of the whole image. On the other hand, if there is a known relationship between how variations in the tool might impact the gray level of the oxide, then that relationship can be used to factor out the gray level variations in the measurement of the contact.

Flooding Using Flood Gun or Main Beam

The electron signal from a given location on the substrate is generally dependent on the initial charge state of the substrate at that location, including a neighboring distance around that location, where the distance can be on the order of a few millimeters. To minimize and preferably eliminate the impact of the initial charge state of the substrate on the parametric measurement made using the gray level, the surface voltage and charge state of the substrate can be taken to a known and repeatable value prior to the actual imaging.

One way of doing this is to use a large beam electron gun with a high current density that is used to scan around the measurement area or across the whole substrate, while maintaining a fixed field above the surface (such as by using a Wehnelt plate). Such a gun, also referred to as flood gun, is preferably selected so as to have enough current density to bring the substrate surface to a steady state potential. Another way of achieving the same goal is to use one or more dummy scans with a large field-of-view around the measurement area, using the regular small spot size beam to make the electron-beam image. This dummy electron beam scan is not used for gathering any gray level image, but instead is preferably used only to take the substrate to a known and controlled charge state. It is preferably also done while maintaining a fixed field above the substrate surface (again, such as by using a Wehnelt plate).

Kelvin Probe

In the method described above, we can additionally check to see that the surface state and voltage is repeatable and at a desired level prior to imaging. This can be done such as by using a Kelvin probe measurement above the measurement point. A Kelvin probe can be used to measure the surface voltage at any point. This measurement can be done to verify the substrate state when pulled from the line or to verify the surface state after the substrate surface has been flooded. If there are variations in the Kelvin probe voltage from one substrate to another, we may also desire to factor this in as a correction to the gray level, if its impact is understood analytically or through modeling.

Swathing

Swath images (where the stage moves continuously) may be used as an alternate means for collecting gray level data. Swath images have the advantage of being able to collect a larger amount of data because the stage does not need to move and settle between frames. In addition, there may be cases where it is desirable to collect gray level data in the same way that swath inspection data is collected. In fact, in some cases it may be possible and desirable to use the same swath data for gray level and for defect inspection.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of increasing consistency between separate parametric measurement readings that are taken with an electron beam imaging tool at different times within a period of time, the method comprising the step of correcting gray level drift in an output of the imaging tool at a time frequency that is less than a time period during which the drift is anticipated to be undesirably large.

2. The method of claim 1, wherein swath images are used to collect gray level data.

3. The method of claim 1, wherein the step of correcting the drift is accomplished with the imaging tool in mirror mode.

4. The method of claim 1, wherein the step of correcting the gray level drift comprises:

taking a parametric measurement on a reference sample, and adjusting an electron yield of the reference sample to remain substantially constant over time, thereby causing the gray level of the imaging tool to also remain constant in time for a given amplifier gain and offset.

5. The method of claim 4, wherein the reference sample has a fixed material composition, a fixed topography, and a fixed surface potential.

6. The method of claim 1, wherein the gray level used for the calibration is read only from a subset of structures on a sample.

7. The method of claim 6, wherein the gray level used for the calibration is selected by forming a histogram of gray levels from the sample, and a difference between selected portions of the gray level histogram is used for the calibration.

8. The method of claim 1, wherein the step of correcting the drift comprises constructing a model of the drift of the imaging tool at different operational settings, and using the model to correct the drift of the imaging tool.

9. The method of claim 8, wherein the model is an empirically derived model.

10. The method of claim 8, wherein the model is a mathematically derived model.

11. The method of claim 10, wherein the mathematically derived model comprises measuring a gray level of an image as a function of different values of incoming beam currents, amplifier gain, and offsets, and constructing a relationship between predicted gray level and observed gray level of the image.

12. The method of claim 1, wherein the step of correcting the drift comprises taking a surface voltage and charge state of a sample to a known and repeatable value prior to imaging the sample, so as to reduce effects of an initial charge state of the sample on the parametric measurement taken.

13. The method of claim 12, wherein the surface voltage and charge state of the sample is taken to the known and repeatable value by performing at least one dummy scan around the measurement area before taking actual parametric measurement readings.

14. The method of claim 12, wherein the surface voltage and charge state of the sample is taken to the known and repeatable value by scanning at least a measurement area of the sample with an electron gun while maintaining a fixed field above a surface of the sample.

15. The method of claim 14, wherein the electron gun has a current density that is sufficient to bring the surface of the sample to a steady state potential.

16. The method of claim 14, wherein the fixed field above the surface of the sample is maintained with a Wehnelt plate.

17. A method of increasing consistency between separate parametric measurement readings that are taken with an electron beam imaging tool at different times within a period of time, the method comprising the step of correcting drift in an imaging tool at a time frequency that is less than a time period during which the drift is anticipated to be undesirably large, by checking that a surface state and voltage of a sample is repeatable and at a desired level prior to taking the parametric measurement readings by using a Kelvin probe measurement above a measurement point of the sample.

18. A method of characterizing image data, the method comprising the steps of:
    extracting gray level data from the image data;
    creating a histogram of the gray level data, and
    comparing properties of the histogram to historical histogram properties to characterize the image data.

19. A method of characterizing image data, the method comprising the steps of:
    creating the image data from swath images,
    extracting characterizing data from the image data, where the characterizing data is characteristic of properties of a sample from which the image data is gathered, and
    comparing properties of the characterizing data to historical characterizing data properties to characterize the image data.

* * * * *

UNITED STATES PATENT AND TRADEMARK OFFICE
CERTIFICATE OF CORRECTION

PATENT NO. : 7,660,687 B1  Page 1 of 1
APPLICATION NO. : 11/420243
DATED : February 9, 2010
INVENTOR(S) : De et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 686 days.

Signed and Sealed this

Twenty-eighth Day of December, 2010

David J. Kappos
*Director of the United States Patent and Trademark Office*